US006872643B1

(12) United States Patent
Halliyal et al.

(10) Patent No.: US 6,872,643 B1
(45) Date of Patent: Mar. 29, 2005

(54) IMPLANT DAMAGE REMOVAL BY LASER THERMAL ANNEALING

(75) Inventors: Arvind Halliyal, Cupertino, CA (US); Nicholas H. Tripsas, San Jose, CA (US); Mark T. Ramsbey, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 41 days.

(21) Appl. No.: 10/378,885

(22) Filed: Mar. 5, 2003

(51) Int. Cl.[7] .............................................. H01L 21/22
(52) U.S. Cl. ....................... 438/557; 438/558; 438/661; 438/662; 438/914
(58) Field of Search ................................ 438/261–264, 438/257–259, 514, 637, 762, 785, 390–392, 305–308, 557, 558, 660, 662, 914, 923

(56) References Cited

U.S. PATENT DOCUMENTS 6,403,420 B1 * 6/2002 Yang et al. ................. 438/261
6,500,713 B1 * 12/2002 Ramsbey et al. ........... 438/258

* cited by examiner

*Primary Examiner*—Carl Whitehead, Jr.
*Assistant Examiner*—Yennhu B. Huynh

(57) ABSTRACT

A method of manufacturing a semiconductor device includes forming a layer over a substrate, and doping the layer with a dopant, after which the layer is laser thermal annealed. The layer can be a nitride, an oxide, or a polysilicon layer. The dopants can be arsenic, phosphorous, boron, or nitrogen. During the laser thermal annealing, certain portions of a surface of the semiconductor device are laser thermal annealed and other portions of a surface of the semiconductor device are not exposed. Also, the surface of the layer is smoother after the laser thermal annealing.

4 Claims, 2 Drawing Sheets

IMPLANT DAMAGE REMOVAL BY LASER THERMAL ANNEALING

FIELD OF THE INVENTION

The present invention relates to the manufacturing of semiconductor devices, and more particularly, to laser thermal processes providing improved efficiency.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device includes a semiconductor substrate on which a gate electrode is disposed over a gate dielectric. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

Ion implantation of dopant species is used throughout the process in the fabrication of MOS transistors. Implants are used to selectively dope regions to form conductive pathways in the silicon wafer and for other purposes. Ion implantation is a good method for introducing dopants because during manufacture, the dose and energy at which the species are introduced can be controlled very accurately. One drawback of ion implantation is the creation of a damaged region that includes defects in the silicon lattice or other layers, such as oxide, nitride or polysilicon layers, which have adverse effects on transistor fabrication at later steps. One defect is the creation of amorphous silicon which must be annealed to return it to its crystalline state. This anneal is an added thermal cycle which must be taken into account when designing both n-channel and p-channel transistors.

An anneal can occur in a furnace or in a rapid-thermal-anneal ("RTA") chamber. An RTA process is typically performed at between 400 and 1150° C. and lasts anywhere from a few seconds to a few minutes. Large area incoherent energy sources provide uniform heating of the wafers. These sources emit radiant light which allows very rapid and uniform heating and cooling. Wafers are thermally isolated so that radiant (not conductive) heating and cooling is dominant. Various heat sources are utilized, including arc lamps, tungsten-halogen lamps, and resistively-heated slotted graphite sheets. Most heating is performed in inert atmospheres (argon or nitrogen) or vacuum, although oxygen or ammonia can be used for respectively growing silicon dioxide and silicon nitride.

The RTA anneal cycle, however, takes away from the thermal budget of the semiconductor device, and the RTA annealing also provides the heat for already present dopants and the just implanted dopants to diffuse. As a byproduct to the anneal cycle, dopants segregate and migrate in a vertical as well as horizontal direction. Diffusion causes enlargement of the doped areas, which in certain instances, leads to enhanced parasitic problems. Furthermore, diffusion of low-density dopants into the channel causes enhanced short channel effect problems. While it is desirable to anneal implant damage, a need exists for a more effective method for repairing implant damage while minimizing the migration of implanted dopants.

SUMMARY OF THE INVENTION

This and other needs are met by embodiments of the present invention which provide a method of manufacturing a semiconductor device. The method includes forming a layer over a substrate and doping the layer with a dopant, after which the layer is laser thermal annealed to reduce damage in the layer caused by doping. The layer can be a nitride, an oxide, or a polysilicon layer. The dopants can include arsenic, phosphorous, boron, indium, antimony or nitrogen. During the laser thermal annealing, certain portions of a surface of the semiconductor device are laser thermal annealed and other portions of a surface of the semiconductor device are not exposed.

By laser thermal annealing the layer, a faster annealing process can be provided. This combined with selective irradiation of only portions of the surface of the semiconductor device reduces the amount of heat introduced into the semiconductor device. As such, dopant profiles within the semiconductor device are changed less. The quick heating and cooling also provides a layer with a more uniform grain size. The laser thermal annealing process can also remove carbon and organics from the surface of the layer. Also, the surface of the layer is smoother after the step of laser thermal annealing.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

Reference is made to the attached drawings, wherein.

DETAILED DESCRIPTION OF THE INVENTION

Figure 1:
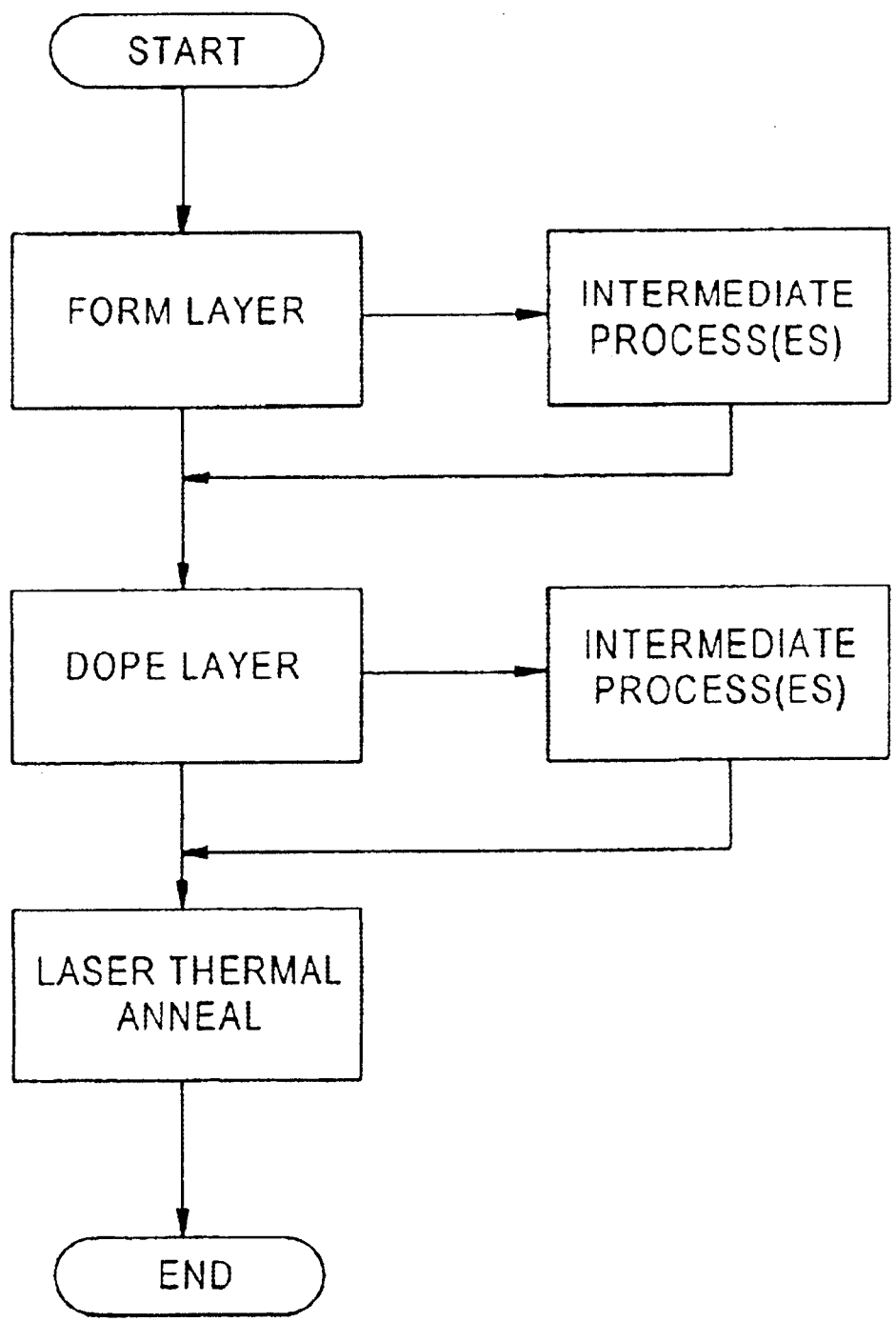
FIG. 1 is a schematic diagram illustrating a process for repairing implant-induced damage in a layer according to an embodiment of the present invention.
Figure 2:
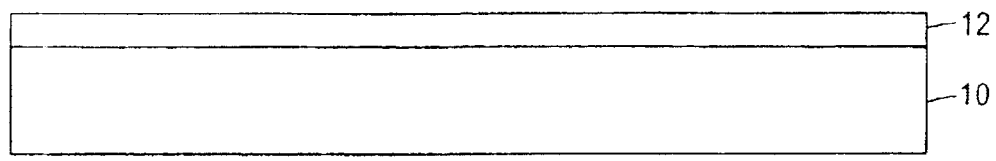
FIG. 2 is a schematic illustration of a second layer being formed over a first layer.

The present invention repairs, at least in part, the damage caused to a layer in a semiconductor device caused by doping of the layer. This is achieved, in part, by laser thermal annealing the layer after the layer has been doped. In so doing, the semiconductor device can be subjected to a reduced heat load and the annealing of the layer can be performed faster as compared to conventional annealing processes. FIG. 1 schematically illustrates process steps for repairing implant-induced damage in a layer.

Referring to FIG. 1, in one aspect of the invention, a layer or film 12 of nitride is formed over another layer 10, such as a silicon substrate, and the invention is not limited as to the manner in which the nitride layer is formed. Furthermore, the nitride film is not limited as to a particular nitride. For example, the nitride layer can be tantalum nitride. However, in a current aspect, the nitride layer is silicon nitride. If, for example, the nitride layer is to be used as a gate dielectric, the following process can be used to form the nitride layer.

The nitride layer can be formed using a standard low pressure chemical vapor deposition process (LPCVD). The nitride deposition can be also be performed in a furnace using a batch process or in a single wafer deposition tool using rapid thermal chemical vapor deposition (RTCVD). In LPCVD or RTCVD processes, nitride can be deposited by reacting silane or dichlorosilane with ammonia or nitrogen at temperatures ranging from about 700 to about 800° C.

In another aspect of the invention, a layer or film 12 of oxide is formed over the other layer 10 using any conventional method. Furthermore, the oxide film is not limited as to a particular oxide. For example, the oxide layer can be silicon oxide. An example method of forming the oxide layer involves subjecting a substrate to thermal oxidation at temperatures between about 700 and 1000° C. in an oxygen or oxygen-steam ambient. In an alternative process, the oxide layer 16 is formed using a LPCVD or plasma enhanced chemical vapor deposition process with a source of oxygen.

In still another aspect of the invention, a layer or film 12 of polysilicon is formed over the other layer 10, and the invention is not limited as to the manner in which the polysilicon layer is formed. If, for example, the polysilicon layer is to be used in the formation of a gate electrode, the following process can be used to form the polysilicon layer. The formation of a gate electrode typically involves depositing a first blanket layer of undoped polysilicon, for example by low pressure chemical vapor deposition (LPCVD) at temperatures from about 550 to 800° C., over a substrate and/or on the top surface of a gate oxide. Although not limited in this manner, the polysilicon layer can have a thickness from about 100 to 2000 angstroms. Alternatively, the layer or film 12 can be formed from SiGe deposited by reacting gasses containing Si and Ge, such as $SiH_4$ and $GeH_4$.

Figure 3:
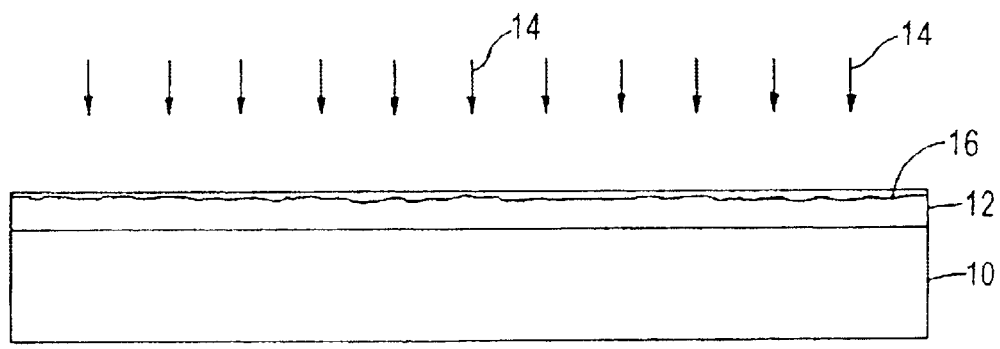
FIG. 3 is a schematic illustration of the second layer being subjected to doping.

Immediately after formation of the layer 12 of nitride, oxide, or polysilicon (hereinafter referred to as "layer") or after one or more intermediate processing steps subsequent to the formation of the layer, the layer is subjected to doping, as illustrated with arrows 14 in FIG. 3. Although the doping is not limited as to a particular type of doping, in at least one aspect of the invention, the doping is performed by ion implantation. The ion to be implanted may be an n-type dopant, such as arsenic, antimony or phosphorus; a p-type dopant, such as boron or indium; or a neutral dopant, such as silicon or germanium. Illustrative examples of implant energies and dosages for doping respectively range between about $5 \times 10^{12}$ and $5 \times 10^{15}$ dopants/cm$^2$, and at an energy level between about 5 keV and 100 keV. An alternative ion to be implanted may be nitrogen, which, for example, can be used to retard the diffusion of boron atoms in a polysilicon layer. Although not limited in this manner, the implantation of the nitrogen ions can be at a dosage between about $5 \times 10^{14}$ and $5 \times 10^{15}$ dopants/cm$^2$, and at an energy level between about 20 and 200 keV. As previously mentioned, the doping of the layer 12 can create a damaged region 16 in the layer 12.

Figure 4:
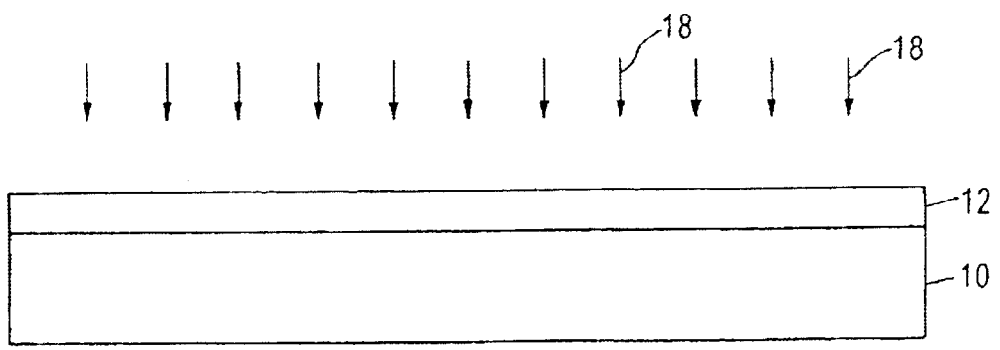
FIG. 4 is a schematic illustration of damage to the second layer being repaired by laser thermal annealing according to an embodiment of the present invention.

Immediately after doping of the layer 12 or after one or more intermediate processing steps subsequent to doping of the layer 12, the layer 12 is subjected to a laser thermal anneal to repair at least a portion of the damage to the damaged region 16 of the layer 12 caused by the doping, as illustrated in FIG. 4. During the laser thermal annealing, the energy from the laser is applied to layer, as illustrated with arrows 18. An example of a laser capable of providing this energy is a spatially homogenized 308 nm XeCl pulsed laser. However, the invention is not limited in this manner, and the energy and power of the laser can vary in accordance with different applications. For example, in one aspect, the energy can be sufficient to melt at least a portion of the layer, or in other aspects, the energy can partially anneal the layer without melting. Although not limited in this manner, the fluence range for laser irradiation can extend all the way from about 1 mJ/cm$^2$ to about 1.3 J/cm$^2$.

The energy fluence of the laser at the surface determines the melt duration or the amount of partial annealing (hereinafter referred to as melt duration) that occurs at the surface, and melt duration is related to maximum melt depth. The relationship between melt time and maximum melt depth depends on the temporal profile of the laser beam. Precise control of the energy fluence is possible due to the capability of measuring the full width height maximum (FWHM) of the laser and the surface melt duration during the process. Relatively large changes in the energy fluence are required to create small changes in the maximum melt depth. The dosage is controlled by the total melt time. The total melt time can be varied by varying the number and/or energy of the laser pulses. After the layer has been melted, which is for approximately 30–100 nanoseconds, the material of the layer will cool rapidly, within about one microsecond, and the layer will reform epitaxially. In so doing, damage caused by the doping process will be removed. Furthermore, the rapid cooling of the layer allows for a more uniform grain size, and therefore, a better microstructure.

In addition to reducing damage caused by doping, the laser thermal annealing process can provide other advantages. The laser thermal annealing process can be selectively applied to only certain portions of the surface of the semiconductor device. In so doing, only those portions of the semiconductor device that are to be annealed need undergo the laser thermal annealing process. Furthermore, the laser thermal annealing process can be shorter than conventional annealing processes. For these reasons, less thermal energy is introduced into the semiconductor device by the laser thermal annealing as compared to conventional annealing processes. By reducing the amount of thermal energy introduced into the semiconductor device, the dopant profiles within the semiconductor are not as changed as the profiles would be with conventional annealing processes.

The amount of thermal energy introduced into the semiconductor device can be further reduced by only melting a portion of the layer. Still further, the energy fluence of the laser can be adjusted so as to not produce any melting of the layer. This "sub melting" laser energy, however, can still be sufficient to reduce the damage caused by the doping process by providing sufficient thermal energy to allow for some reordering of the lattice structure within the layer.

Other advantages of the laser thermal annealing process is that, after melting, the surface of the layer is flatter than before laser thermal annealing. With certain deposition methods, the layer is initially not formed evenly and many high and low points can exist at the surface. However, after the layer has been melted, the layer will tend to reform more smoothly. The laser thermal annealing process can also volatilize impurities such as carbon and organics that are on the surface of the layer.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:
    forming a nitride layer over a substrate;
    doping the nitride layer with a dopant; and
    laser thermal annealing the nitride layer after the step of doping, wherein
    at least a portion of the nitride layer is melted during the step of laser thermal annealing.

2. The method of manufacturing a semiconductor device according to claim 1, wherein the dopant is selected from the group consisting of arsenic, antimony, indium, phosphorous, boron, and nitrogen.

3. The method of manufacturing a semiconductor device according to claim 1, wherein a surface of the nitride layer is smoother after the step of laser thermal annealing.

4. The method of manufacturing a semiconductor device according to claim 1, wherein during the step of laser thermal annealing, certain portions of a surface of the semiconductor device are exposed to the laser thermal annealing and other portions of a surface of the semiconductor are not exposed.

* * * * *